(12) United States Patent
Gillespie et al.

(10) Patent No.: US 7,227,400 B1
(45) Date of Patent: Jun. 5, 2007

(54) HIGH SPEED MOSFET OUTPUT DRIVER

(75) Inventors: Timothy Gillespie, Beverly Hills (AU); William G. Baker, North Parramatta (AU)

(73) Assignee: Integrated Device Technology, Inc., San Jose, CA (US)

( * ) Notice: Subject to any disclaimer, the term of this patent is extended or adjusted under 35 U.S.C. 154(b) by 17 days.

(21) Appl. No.: 11/179,072

(22) Filed: Jul. 12, 2005

Related U.S. Application Data

(60) Provisional application No. 60/658,855, filed on Mar. 30, 2005.

(51) Int. Cl.
*H03L 5/00* (2006.01)
(52) U.S. Cl. ...................................... 327/333
(58) Field of Classification Search ................ 327/309, 327/321, 333; 326/80–81
See application file for complete search history.

(56) References Cited

U.S. PATENT DOCUMENTS

| | | | |
|---|---|---|---|
| 5,539,334 A | 7/1996 | Clapp, III et al. | |
| 5,798,972 A * | 8/1998 | Lao et al. | 365/189.11 |
| 5,969,542 A | 10/1999 | Maley et al. | |
| 6,147,540 A | 11/2000 | Coddington | |
| 6,268,744 B1 * | 7/2001 | Drapkin et al. | 326/81 |
| 6,407,579 B1 | 6/2002 | Goswick | |
| 6,433,582 B2 | 8/2002 | Hirano | |
| 6,614,283 B1 | 9/2003 | Wright et al. | |
| 6,642,769 B1 | 11/2003 | Chang et al. | |
| 6,677,798 B2 | 1/2004 | Chang et al. | |
| 6,833,746 B2 * | 12/2004 | Drapkin et al. | 327/333 |
| 6,946,893 B2 * | 9/2005 | Hayashi et al. | 327/333 |
| 7,026,855 B2 * | 4/2006 | Sueoka et al. | 327/333 |

OTHER PUBLICATIONS

Dong Pan, Harry W. Li, and Bogdan M. Wiliamowski, "A Low Voltage to High Voltage Level Shifter Circuit for MEMS Appication."

* cited by examiner

*Primary Examiner*—My-Trang Nuton
(74) *Attorney, Agent, or Firm*—Kenneth Glass; Glass & Associates

(57) ABSTRACT

A high speed MOSFET output driver is disclosed that includes a voltage level shifter stage operable to transition an input signal at a first voltage level to an output signal at a second voltage level, an output stage operable to drive high voltage output load, and a hot inverter, biased between the second voltage level and the bias voltage such that the voltage gain of the output signal is increased and at the same time the minimum voltage level of the output signal introduced to the output stage is decreased, improving the control and the transition time of the output signal and allowing all components of the high speed MOSFET output driver of the present invention to be fabricated using a single thin gate oxide process.

26 Claims, 12 Drawing Sheets

HIGH SPEED MOSFET OUTPUT DRIVER

CROSS-REFERENCE TO RELATED APPLICATIONS

The present application claims benefit of U.S. Provisional Patent Application Ser. No. 60/658,855, filed Mar. 30, 2005, entitled "Output Driver, Auto Voltage Sensing Circuit and Input Buffer."

FIELD OF THE INVENTION

The present invention relates generally to the field of semiconductor integrated circuits. More specifically, the present invention relates to voltage output drivers and voltage level shifter circuits.

BACKGROUND ART

The nominal operating supply voltage for semiconductor integrated circuits is falling steadily because of the need to reduce power consumption and maintain high reliability. Furthermore, the advent of System on Chip (SOC) technology and Application-Specific Integrated Circuits (ASIC) increases the tendency to integrate different core subsystems at different supply voltages into the same semiconductor integrated circuit. High voltage output drivers are needed to interface between the core subsystems of different supply voltages. Conventional high voltage output drivers usually include a voltage level shifter stage and an output stage. The voltage level shifter stage generates the pull-up and pull-down signal to convert the low voltage input signal to a high voltage output signal. The input circuit of the voltage level shifter stage is typically operational at a low voltage level and thus is fabricated using the 0.35 µm process. The output stage receives the output signal at a higher voltage level (i.e., 3.3 volts) and thus is fabricated using the 0.8 µm process. As such, a dual oxide process is necessary to provide an input circuit using 0.35 µm technology and an output circuit using 0.8 µm technology. Utilizing such a dual process is expensive and produces slow switching speeds. Moreover, as the devices continue to shrink in size and increase in speed, high voltage output drivers with dual gate oxide components are no longer suitable for many applications.

Some prior art high voltage output drivers use high voltage cascode devices to solve the above identified problems. However, these high voltage output drivers are not fast enough for many applications. In addition, they exhibit DC leakage current problems, high power consumption, high internal voltage swing problems, and slow switching speed.

Thus, there is a need in the art for a high speed output driver that does not require dual gate processes. In addition, there is a need for a high speed output driver having high switching speed, low power consumption, low leakage current, and minimal output waveform distortion. The present invention meets the above needs.

SUMMARY OF THE INVENTION

The present invention provides a high speed metal oxide semiconductor field effect transistor (MOSFET) output driver to drive a high voltage output load using a low voltage input signal. The high speed MOSFET output driver includes a voltage level shifter stage, a hot inverter, and an output stage. The voltage level shifter stage is operable to transition an input signal at a first voltage level to an output signal at a second voltage level. The hot inverter is biased between the second voltage level and a bias voltage level such that the voltage gain of the output signal is increased and the minimum voltage level of the output signal is decreased. The output stage receives the output signal to drive an output load operating at the second voltage level.

A method of driving an output load is disclosed that includes receiving an input signal at a first voltage level, shifting the input signal at the first voltage level to an output signal at a second voltage level using a voltage level shifter stage, increasing a voltage gain of the output signal and at the same time reducing the minimum voltage level of the output signal using a hot inverter, and driving an output load using that output signal. This method improves the control of the output signal and at the same time protects the components of the next stage.

The high speed MOSFET output driver of the present invention does not require a dual oxide fabrication process as do prior art high speed output drivers, resulting in reduced fabrication cost and significant improvements in performance. In the present embodiment, all of the transistors in the high speed MOSFET drivers are thin-gate transistors formed using a single thin gate oxide process, producing a high speed MOSFET output driver that has a higher switching speed than prior art high voltage output drivers.

These and other advantages of the present invention will no doubt become obvious to those of ordinary skill in the art after having read the following detailed description of the preferred embodiments, which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
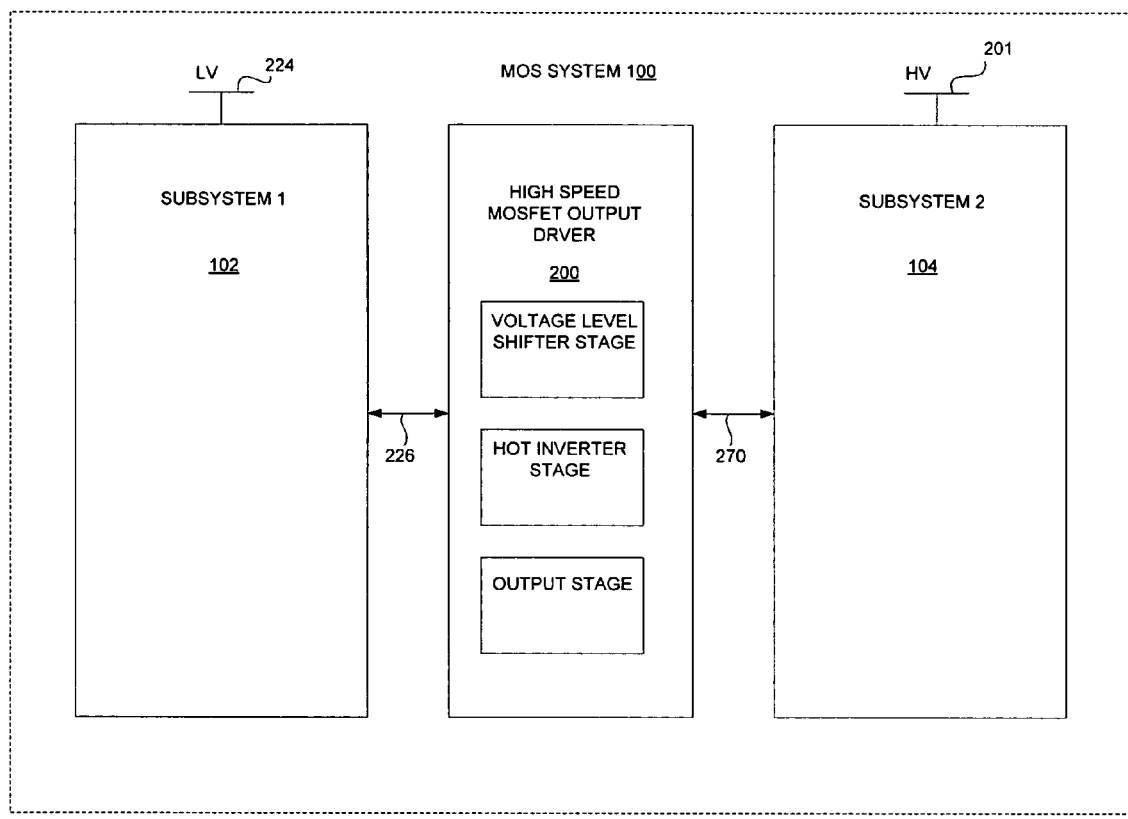
FIG. 1 illustrates a Metal Oxide Semiconductor (MOS) system that uses a high speed MOSFET output driver that includes a hot inverter to enable two subsystems that operate at different logic voltage levels to work together to general an output signal at the desired logic state in accordance with an embodiment of the present invention.

FIG. 1 illustrates a Metal Oxide Semiconductor (MOS) system 100 that uses a high speed MOSFET output driver 200 that includes a hot inverter in accordance with an embodiment of the present invention to enable subsystem 102 and subsystem 104, that operate at different logic voltages, to work together to generate an output signal at the desired logic state. The term hot inverter as used in the present application includes an inverter that is biased to voltage sources rather than electrical ground. Metal Oxide Semiconductor (MOS) system 100 includes a first subsystem 102 operating at a first voltage level (LV) 224, a second subsystem 104 operating at a second voltage level (HV) 201. High speed MOSFET output driver 200 in accordance to the present invention is used by MOS system 100 to receive output logic signals at first voltage level (LV) 224 from first subsystem 102 to transition them to other output signals at second voltage level (HV) 201 that can be used by second subsystem 104.

Figure 2:
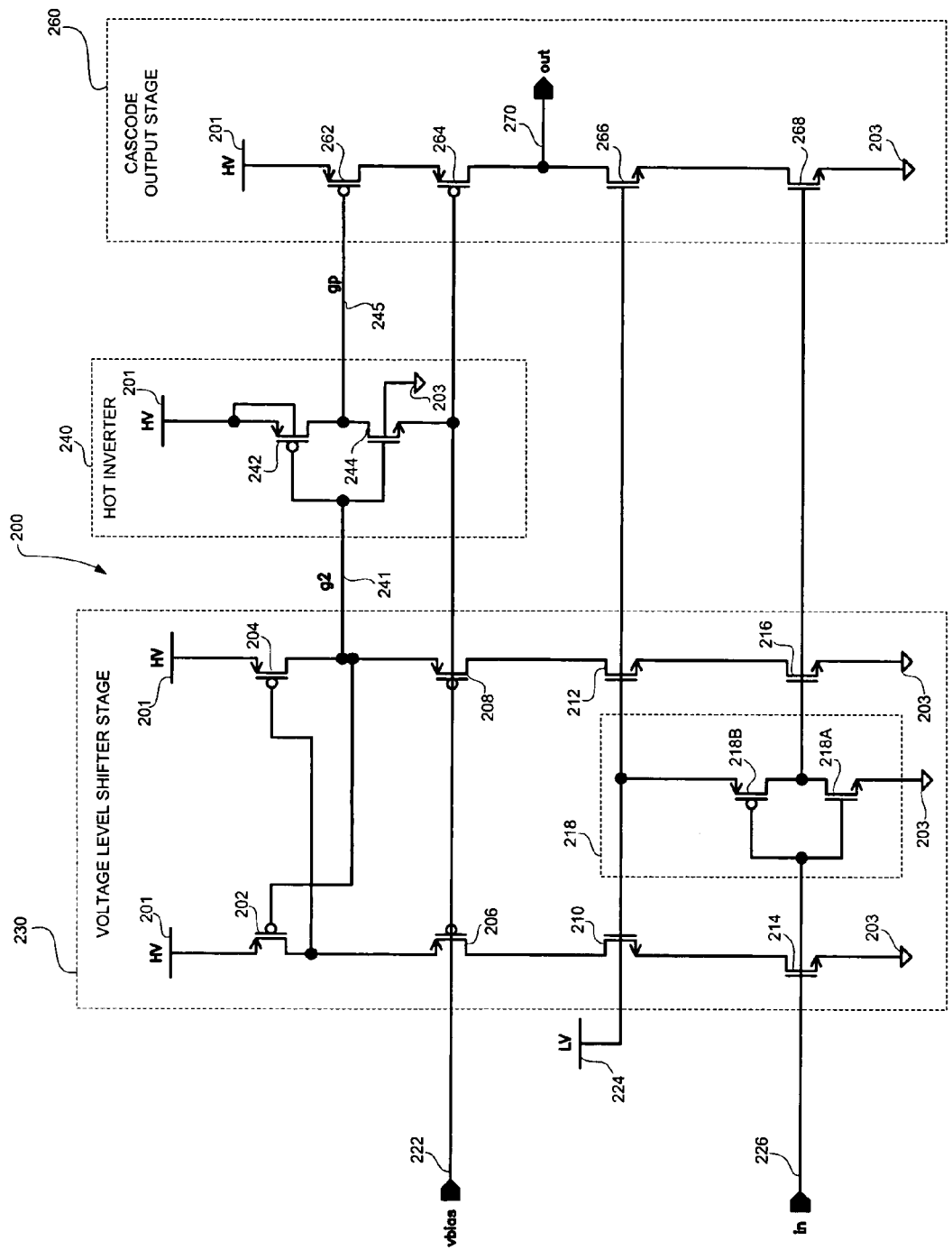
FIG. 2 illustrates a schematic diagram of a high speed MOSFET output driver that includes a hot inverter in accordance with an embodiment of the present invention.

FIG. 2 illustrates a schematic diagram of a high speed Metal Oxide Semiconductor (MOSFET) output driver 200 in accordance with an embodiment of the present invention. High speed MOSFET output driver 200 includes a hot inverter 240 that reduces the minimum voltage level of the output signal introduced to the output stage 260 and at the same time increase the voltage gain of the voltage level shifter stage 230. As a result, the output signal has better transition time and is better controlled. Furthermore, high speed MOSFET output driver 200 can use devices that are fabricated by a single thin gate oxide process. The term "thin gate oxide" as used in the present invention includes devices having a gate oxide thickness of 50 angstroms or less. The term "single thin gate oxide process" includes those semiconductor fabrication processes that form Metal Oxide Semiconductor Field Effect Transistor (MOSFET) devices having a gate oxide thickness that is less than 50 angstroms. In addition, the use of a hot inverter 240 reduces the gate voltage applied to the output stage 260, thereby increasing the speed of the circuit.

A high speed MOSFET voltage output 200 is shown in FIG. 2 that includes a voltage level shifter stage 230, a hot inverter 240, and an output stage 260. Voltage level shifter stage 230 further includes a pair of cross-coupled PMOS transistors 202 and 204, PMOS transistors 206–208, NMOS transistors 210–212, and a pair of input NMOS transistors 214–216 separated by an inverter 218. PMOS transistor 202 and PMOS transistor 204 provide the differential amplification to produce a high voltage logic signal. PMOS transistors 202 and 204 are operable to pull up the input signal from a first voltage level (LV) 224 to an output signal at a second voltage level (HV) 201. The gate of PMOS transistor 202 is coupled to the drain of PMOS transistor 204. The gate of PMOS transistor 204 is electrically connected to the drain of PMOS transistor 202. The source of PMOS transistor 202 and the source of PMOS transistor 204 are electrically connected to the second voltage level (HV) 201.

Continuing with FIG. 2, PMOS transistors 206–208 and NMOS transistors 210–212 are operable to receive a bias voltage ($V_{bias}$) 222 and first voltage level (LV) 224 to protect other thin gate oxide components in high speed MOSFET output driver 200. More particularly, PMOS transistor 206, PMOS transistor 208, NMOS transistor 210, and NMOS transistor 212 are added to limit the maximum voltage seen by any gate oxide component in high speed MOSFET output driver 200. The source of PMOS transistor 206 is electrically connected to the drain of PMOS transistor 202. The source of PMOS transistor 208 is electrically connected to the drain of PMOS transistor 204. The gate of PMOS transistor 206 is electrically connected to the gate of PMOS transistor 208 and to bias voltage ($V_{bias}$) 222. The gates of NMOS transistor 210 and NMOS transistor 212 are electrically connected to first voltage level (LV) 224. The drain of first NMOS transistor 210 is electrically connected to the drain of PMOS transistor 206. The drain of NMOS transistor 212 is electrically connected to the drain of PMOS transistor 208.

Continuing with FIG. 2, the input pair of NMOS transistors 214–216 form an input circuit which is operable to receive input signal 226 at first voltage level (LV) 224. The drain of NMOS transistor 214 is electrically connected to the source of NMOS transistor 210. The gate of NMOS transistor 214 is electrically connected to input signal 226 and to the input of inverter 218. The output of inverter 218 is electrically connected to the gate of NMOS transistor 216. The drain of NMOS transistor 216 is electrically connected to the source of NMOS transistor 212. The sources of both NMOS transistor 214 and NMOS transistor 216 are electrically connected to an electrical ground 203. Inverter 218 includes a pull-down NMOS transistor 218A and a pull-up PMOS transistor 218B. The gates of pull-up PMOS transistor 218B and pull-down NMOS transistor 218A are electrically connected together to form the input of inverter 218. The input of inverter 218 is electrically connected to input voltage 226. The drain of pull-up PMOS transistor 218B is electrically connected to the drain of pull-down NMOS transistor 218A to form the output of inverter 218. The output of inverter 218 is electrically connected to the gate of NMOS transistor 216. The source of pull-down NMOS transistor 218A is electrically connected to electrical ground 203. The source of pull-up PMOS transistor 218B is electrically connected to the gates of NMOS transistor 210 and NMOS transistor 212 and to first voltage level (LV) 224.

Continuing with FIG. 2, hot inverter 240 includes a pull-up PMOS transistor 242 electrically connected in series to a pull-down NMOS transistor 244. The term hot inverter as used in the present application includes an inverter that is connected on each end to voltage sources rather than electrical ground 203. The gates of pull-up PMOS transistor 242 and pull-down NMOS transistor 244 are electrically connected together to form the input of hot inverter 240 at node 241. The input of hot inverter 240 is electrically connected to the gate of first PMOS transistor 202. The source of pull-up PMOS transistor 242 is electrically connected to second voltage level (HV) 201. The drain of pull-up PMOS transistor 242 is electrically connected to the drain of pull-down NMOS transistor 244 and forms the output of hot inverter 240 at a node 245. The source of pull-down NMOS transistor 244 is electrically connected to bias voltage ($V_{bias}$) 222. The substrate (bulk) of pull-up PMOS transistors 242 is electrically connected to its source. The substrate of pull-down NMOS transistor 244 is electrically connected to electrical ground 203.

Continuing with FIG. 2, output stage 260 is a cascode inverter that includes two PMOS transistors 262 and 264 with two NMOS transistors 266 and 268. PMOS transistor 264 and NMOS transistor 266 reduce the maximum field at the drain of PMOS transistor 262, reducing the likelihood of damage to the gate oxide of PMOS transistor 262. Output stage 260 is configured to receive the output signal from the hot inverter at node 245 and to generate the desired level shifted voltage at second voltage level (HV) 201. The gate of PMOS transistor 262 is electrically connected to the output 245 of hot inverter 240. The source of PMOS transistor 262 is electrically connected to second voltage level (HV) 201. The drain PMOS transistor 262 is electrically connected to the source of PMOS transistor 264. The drain of PMOS transistor 264 is electrically connected to the drain of NMOS transistor 266 to form an output terminal 270 of high speed MOSFET output driver 200. Output terminal 270 then drives external output loads. The gate of PMOS transistor 264 is electrically connected to the source of pull-down NMOS transistor 244 of hot inverter 240 and to bias voltage ($V_{bias}$) 222. The gate of NMOS transistor 266 is electrically connected to the gates of first NMOS transistor 210 and second NMOS transistor 212 and to first voltage level (LV) 224. The source of NMOS transistor 266 is electrically connected to the drain of NMOS transistor 268. The gate of NMOS transistor 268 is electrically connected to the output of inverter 218 and the gate of fourth NMOS transistor 216. The source of NMOS transistor 268 is electrically connected to ground 203.

Referring again to FIG. 2, when input signal 226 is high, NMOS transistor 214 turns on and pulls down the source of NMOS transistor 210 to electrical ground 203. As a result, the gate source voltage ($V_{gs}$) of NMOS transistor 210 becomes large and turns on NMOS transistor 210. NMOS transistor 210 pulls the drain of PMOS transistor 206. Now, PMOS transistor 206 is on but does not conduct because its source gate voltage ($V_{sg}$) is kept at the limiting voltage which is equal to the sum of bias voltage ($V_{bias}$) 222 and the threshold voltage of PMOS transistor 206 ($V_{bias}+V_{thp}$). As soon as the source gate voltage of PMOS transistor 206 is higher than this limiting voltage ($V_{bias}+V_{thp}$), PMOS transistor 206 conducts and pulls it down to the limiting voltage ($V_{bias}+V_{thp}$). The gate of PMOS transistor 204 is at the limiting voltage ($V_{bias}+V_{thp}$) and PMOS transistor 204 turns on, pulling the gate of PMOS transistor 202 to second voltage level 201. In response, PMOS transistor 202 turns off and voltage at node 241 is at second voltage level (HV) 201.

Referring to FIG. 2 again, as input signal 226 is high, the input to inverter 218 is high, and the output of inverter 218 is low. The output of inverter 218 drives the gate of NMOS transistor 216. As a result, NMOS transistor 216 turns off. Therefore, NMOS transistor 212 is always on but does not conduct. The drain source voltage of NMOS transistor 212 is at first voltage level 224 plus the threshold voltage of NMOS transistor 212 ($LV+V_{thn}$). As PMOS transistor 204 turns on, it pulls up the drain of PMOS transistor 208 to second voltage level (HV) 201. This turns on PMOS transistor 208, pulling the drain of NMOS transistor 212 to second voltage level (HV) 201. Thus, NMOS transistor 212 shields the logic high input at the output of hot inverter 240 (node 245) from electrical ground 203. The output of hot inverter 240 is thus pulled low to bias voltage ($V_{bias}$) 222, turning on PMOS transistor 262 in output stage 260. PMOS transistor 262 conducts and pulls up the source of PMOS transistor 264 to second voltage level (HV) 201. Now, PMOS transistor 264 is on and pulls up output terminal 270 to second voltage level (HV) 201. When input signal 226 is high, NMOS transistor 268 turns off. NMOS transistor 266 also turns off because two conducting PMOS transistors 262–264 pull the drain of NMOS transistor 266 to second voltage level (HV) 201. Thus, NMOS transistors 266 and 268 shield off output terminal 270 at second voltage level (HV) 201 from electrical ground 203.

Referring to FIG. 2 again, when input signal 226 is low, NMOS transistor 214 turns off. NMOS transistor 210 is also turned off because its gate source voltage ($V_{gs}$) is not at first voltage level (LV) 224 anymore. As a result, PMOS transistor 206 does not pull down the gate of PMOS transistor 204 to the limiting voltage ($V_{bias}+V_{thp}$). Second PMOS transistor 204 is turned off. On the other hand, as input signal 226 becomes low, the input to inverter 218 is also low. Thus, the output of inverter 218 is pulled high to first voltage level (LV) 224 by pull-up PMOS transistor 218B. In response, NMOS transistor 216 turns on and pulls the source of NMOS transistor 212 toward electrical ground 203. The gate source voltage ($V_{gs}$) of NMOS transistor 212 increases toward first voltage level (LV) 224 and turns on NMOS transistor 212. The conducting NMOS transistor 212 pulls the drain of PMOS transistor 208 to electrical ground 203. Now PMOS transistor 208 maintains the gate voltage of PMOS transistor 204 at the limiting voltage ($V_{bias}+V_{thp}$). This turns on PMOS transistor 202, pulling the gate of PMOS transistor 204 to second voltage level (HV) 201. As a result, PMOS transistor 204 now turns off. The input to hot inverter 240 at node 241 is now at the limiting voltage ($V_{bias}+V_{thp}$). Thus, pull-up PMOS transistor 242 pulls the output of hot inverter 240 to second voltage level 201. This turns off PMOS transistor 262. Now the source drain voltage ($V_{ds}$) of PMOS transistor 264 is at bias voltage ($V_{bias}$) 222 plus $V_{thp}$($V_{bias}$+$V_{thp}$), which is not high enough to turn on PMOS transistor 264. Thus, both PMOS transistors 262 and 264 are turned off.

Continuing with FIG. 2, as the output of inverter 218 is high, the gate of NMOS transistor 268 is also high. NMOS transistor 268 is on, pulling the source of NMOS transistor 266 toward electrical ground 203. As soon as the source of NMOS transistor 266 is pulled below first voltage level (LV) 224 it will also begin conducting and pull output terminal 270 low. Since the threshold voltage for thin gate oxide NMOS transistors 266–268 is quite low with respect to first voltage level (LV) 224, NMOS transistor 266 easily reaches saturation and does not seriously compromise the switching speed of output stage 260. PMOS transistors 262 and 264 are now off and shield off output terminal 270 from second voltage level (HV) 201.

In the foregoing manner, hot inverter 240 keeps internal voltage swing low, at the limiting voltage ($V_{bias}$+$V_{thp}$), enabling cascode configurations of PMOS transistors 206–208 and NMOS transistors 210–212 in voltage level shifter stage 230, PMOS transistors 262–264, and NMOS transistors 266–268 in output stage 260 to limit the drain source voltage to the limiting voltage ($V_{bias}$+$V_{thp}$) in preventing the oxide damage from occurring in high speed MOSFET output driver 200. In addition, hot inverter 240 reduces the gate voltage to PMOS transistor 264 from the limiting voltage ($V_{bias}$+$V_{thp}$) to $V_{bias}$. Thus, hot inverter 240 increases the gain of voltage level shifter stage 230. As a result, output signal at node 245 has better transition time and is better controlled. Furthermore, all of transistor components 202–216, 128A–128B, 242–244, and 262–268 in high speed MOSFET output driver 200 can be fabricated using a single thin gate oxide process. The present invention provides an output driver demonstrating high speed switching, reduced DC leakage current and reduced fabrication cost.

Table 1 illustrates the gate voltage at PMOS transistors 262 and 264 for both high and low input voltages in accordance with the present invention as compared to a device that does not include hot inverter 240.

TABLE 1

| Input Voltage | Gate Voltage of PMOS Transistor Without Hot Inverter | Gate Voltage of PMOS Transistor With Hot Inverter |
|---|---|---|
| High | HV | HV |
| Low | $V_{bias}$ + $V_{thp}$ | $V_{bias}$ |

Figure 3:
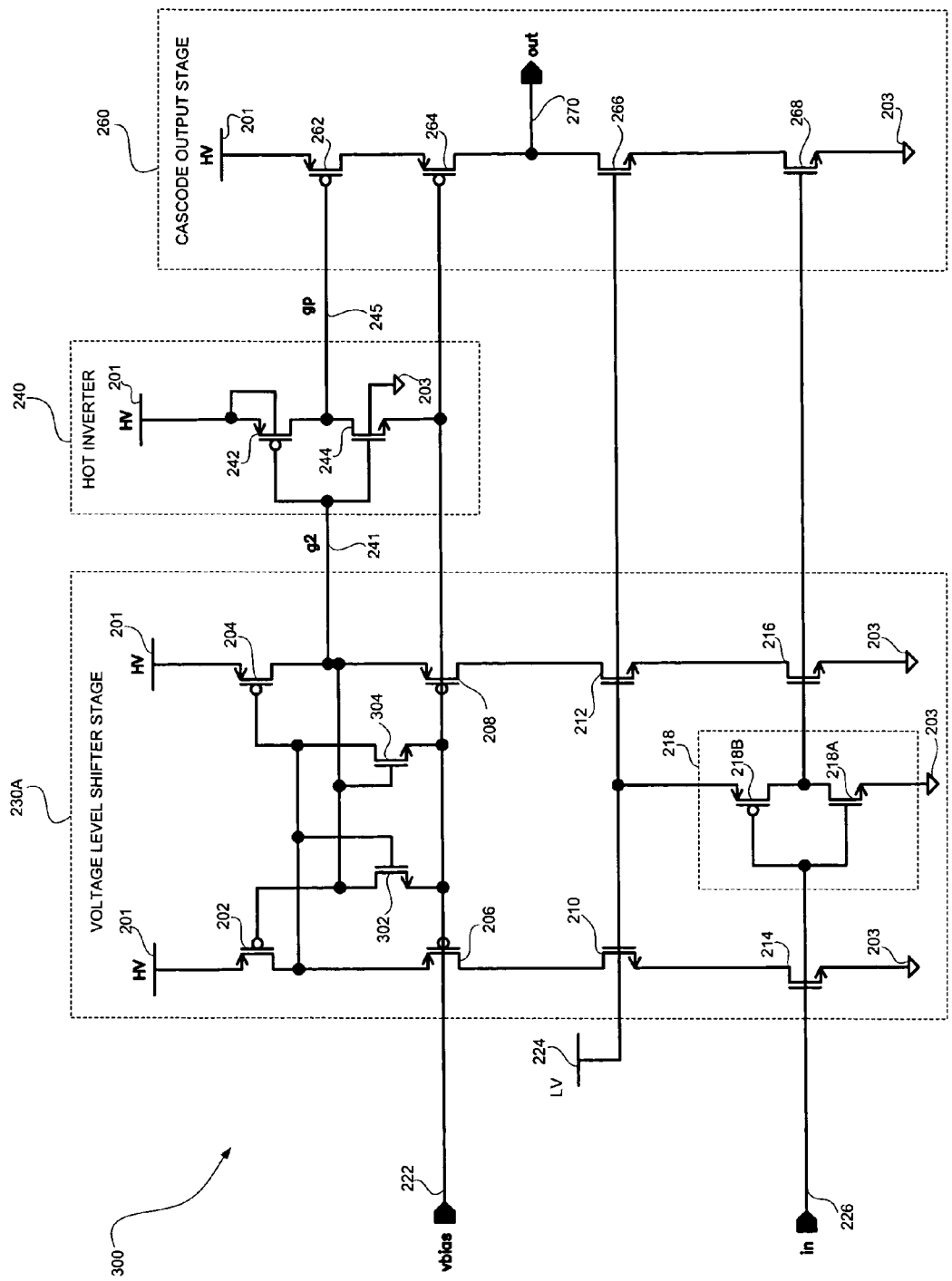
FIG. 3 illustrates a schematic diagram of an embodiment of the high speed MOSFET output driver that includes the hot inverter of FIG. 2 and a voltage level shifter having additional non-cascoded NMOS transistors to further improve the switching time of the output signal in accordance with an embodiment of the present invention.

FIG. 3 shows another embodiment of a high speed MOSFET output driver of the present invention that includes hot inverter 240 of FIG. 2 and voltage level shifter stage 230A using additional non-cascoded NMOS transistors 302–304 to further improve the switching speed of voltage level shifter stage 230 and reduce power consumption in hot inverter 240. The gate of first PMOS transistor 202 is electrically connected to the drain of NMOS transistor 302. The gate of NMOS transistor 302 is electrically connected to the drain of first PMOS transistor 202 and the gate of second PMOS transistor 204. The drain of NMOS transistor 302 is electrically connected to the gate of first NMOS transistor 206 and the drain of second PMOS transistor 204. The gate of NMOS transistor 304 is electrically connected to the drain of second PMOS transistor 204 and to the drain of NMOS transistor 302. The sources of NMOS transistors 302 and 304 are electrically connected to bias voltage ($V_{bias}$) 222.

In the present embodiment, high speed MOSFET output driver 300 includes inverter 240 and output stage 260 that are identical to hot inverter 240 and output stage 260 shown in FIG. 2. Voltage level shifter 230A is the same as voltage level shifter stage 230 except that two additional NMOS transistors 302 and 304 have been added to improve the speed of change in logic state of PMOS transistors 202–204. More particularly, when input signal 226 transitions from logic high to logic low, PMOS transistor 202 changes from on state to off state while PMOS transistor 204 changes from off state to on state. This transition can be slow in the embodiment shown in FIG. 2 because the sources of PMOS transistor 206 and PMOS transistor 208 of FIG. 2 are at the limiting voltage ($V_{bias}$+$V_{thp}$). This limiting voltage ($V_{bias}$+$V_{thp}$) can cause first PMOS transistor 202 and second PMOS transistor 204 of FIG. 2 to go to a confused logic state. In the embodiment shown in FIG. 3, NMOS transistor 302 and NMOS transistor 304 pull the gates of first PMOS transistor 202 and second PMOS transistor 204 to bias voltage ($V_{bias}$) 222 instead of the limiting voltage ($V_{bias}$+$V_{thp}$). Thereby, the speed of change in logic state of PMOS transistor 202 and PMOS transistor 204 is improved while preventing the occurrence of a confused logic state therein.

Figure 4:
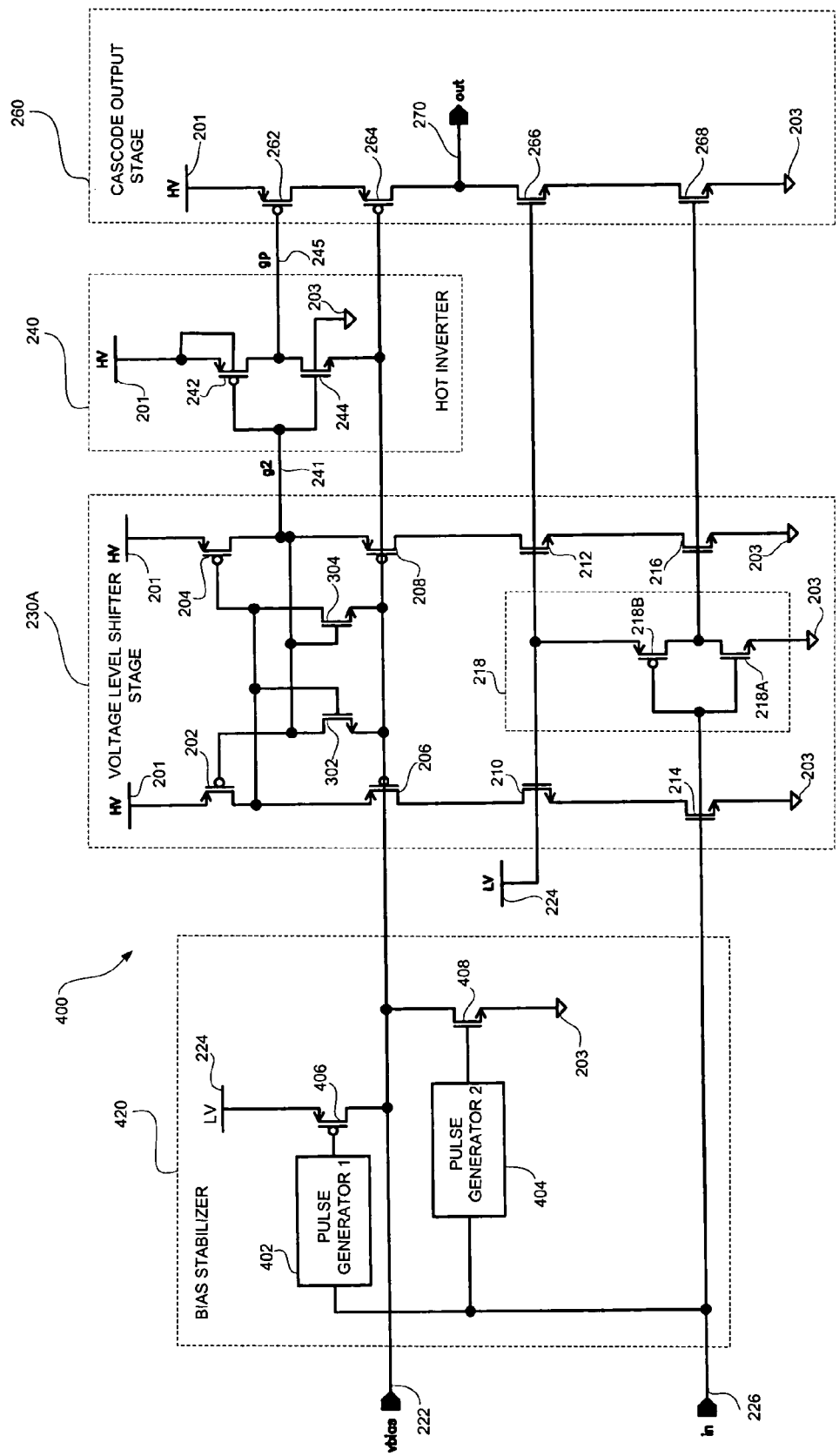
FIG. 4 illustrates a schematic diagram of an embodiment of the high speed MOSFET output driver that includes the hot inverter of FIG. 2, the voltage level shifter stage with non-cascoded NMOS transistors of FIG. 3, and a bias stabilizer to stabilize the bias voltage in accordance with an embodiment of the present invention.

Now referring to FIG. 4, fluctuation of bias voltage ($V_{bias}$) 222 can be caused by change in logic states of MOS transistors 202–212, 242–244, 262–264, and 302–304. This drift in bias voltage ($V_{bias}$) 222 results in decreased switching speed of high speed MOSFET output driver 300 and can even cause breakdown in thin gate oxide PMOS and NMOS transistors. FIG. 4 shows an embodiment of the present invention that includes a bias stabilizer 420 for stabilizing bias voltage ($V_{bias}$) 222. More particularly, a high speed MOSFET output driver 400 is illustrated in FIG. 4 that includes hot inverter 240 described in FIG. 2, voltage level shifter stage 230A with non-cascode NMOS transistors 302–304 as described in FIG. 3, and a bias stabilizer 420 to stabilize the bias voltage ($V_{bias}$) 222 in accordance with the present invention. Bias stabilizer 420 is used to stabilize bias voltage ($V_{bias}$) 222 so that bias stabilizer 420 maintains low output impedance for high speed MOSFET output driver 400.

Continuing with FIG. 4, bias stabilizer 420 includes a first pulse generator 402 coupled to a PMOS transistor 406 and a second pulse generator 404 coupled to an NMOS transistor 408. In one embodiment, first pulse generator 402 and second pulse generator 404 can be an inverter delay chain and an AND gate. The input of first pulse generator 402 is electrically connected to that of second pulse generator 404 and to input signal 226. The output of first pulse generator 402 is electrically connected to the gate of PMOS transistor 406. The source of PMOS transistor 406 is electrically connected to first voltage level (LV) 224. The drain of PMOS transistor 406 is electrically coupled to bias voltage ($V_{bias}$) 222. The output of second pulse generator 404 is electrically connected to the gate of NMOS transistor 408. The drain of NMOS transistor is electrically connected to the drain of PMOS transistor 406 and to bias voltage ($V_{bias}$) 222. The source of NMOS transistor 408 is electrically connected to electrical ground 203. When input signal 226 transitions from logic low to logic high, NMOS transistor 302 turns on and pulls the gate of second PMOS transistor 204 down to bias voltage ($V_{bias}$) 222. As a result, second PMOS transistor 204 is on and pulls the input of hot inverter 240 to second voltage level (HV) 201. NMOS pull-down transistor 244 of hot inverter 240 turns on and pulls down the output of hot inverter 240 toward bias voltage ($V_{bias}$) 222. Accordingly, when input signal 226 goes from logic low to logic high, there is a tendency to pull up bias voltage ($V_{bias}$) 222. Then the second pulse generator 404 is triggered to generate a high output pulse to turn on NMOS transistor 408. As a result, NMOS transistor 408 pulls down bias voltage ($V_{bias}$) 222 toward electrical ground 203, thus balancing the pull-down effect of NMOS transistor 302 and hot inverter 240.

Continuing with FIG. 4, when input signal 226 transitions from logic high to logic low, the input to hot inverter 240 has logic low. Hot inverter 240 pulls up to output logic high. This causes a downward movement to bias voltage ($V_{bias}$) 222. In this situation, first pulse generator 402 is triggered to generate a logic low output pulse. The output pulse turns on PMOS transistor 406. PMOS transistor 406 pulls up bias voltage ($V_{bias}$) 222. As a result, bias stabilizer 420 stabilizes bias voltage ($V_{bias}$) 222.

The high speed MOSFET output driver of the present invention does not require a dual oxide fabrication process as do prior art high speed output drivers, resulting in reduced fabrication cost and significant improvements in performance. In the present embodiment, all of the transistors in the high speed MOSFET drivers are thin-gate transistors formed using a single thin gate oxide process, producing a high speed MOSFET driver that has higher switching speed than prior art high speed MOSFET drivers. Thin oxide components have faster switching time and lower capacitive loads than prior art high voltage output drivers that include thick gate oxide components formed using dual gate processes. As a result, high speed MOSFET output drivers 200, 300, and 400 have less propagation delay, and thus lower crowbar current. Moreover, the resulting lower capacitive loads minimize dynamic power consumption within high speed MOSFET output drivers 200, 300, and 400.

Figure 5:
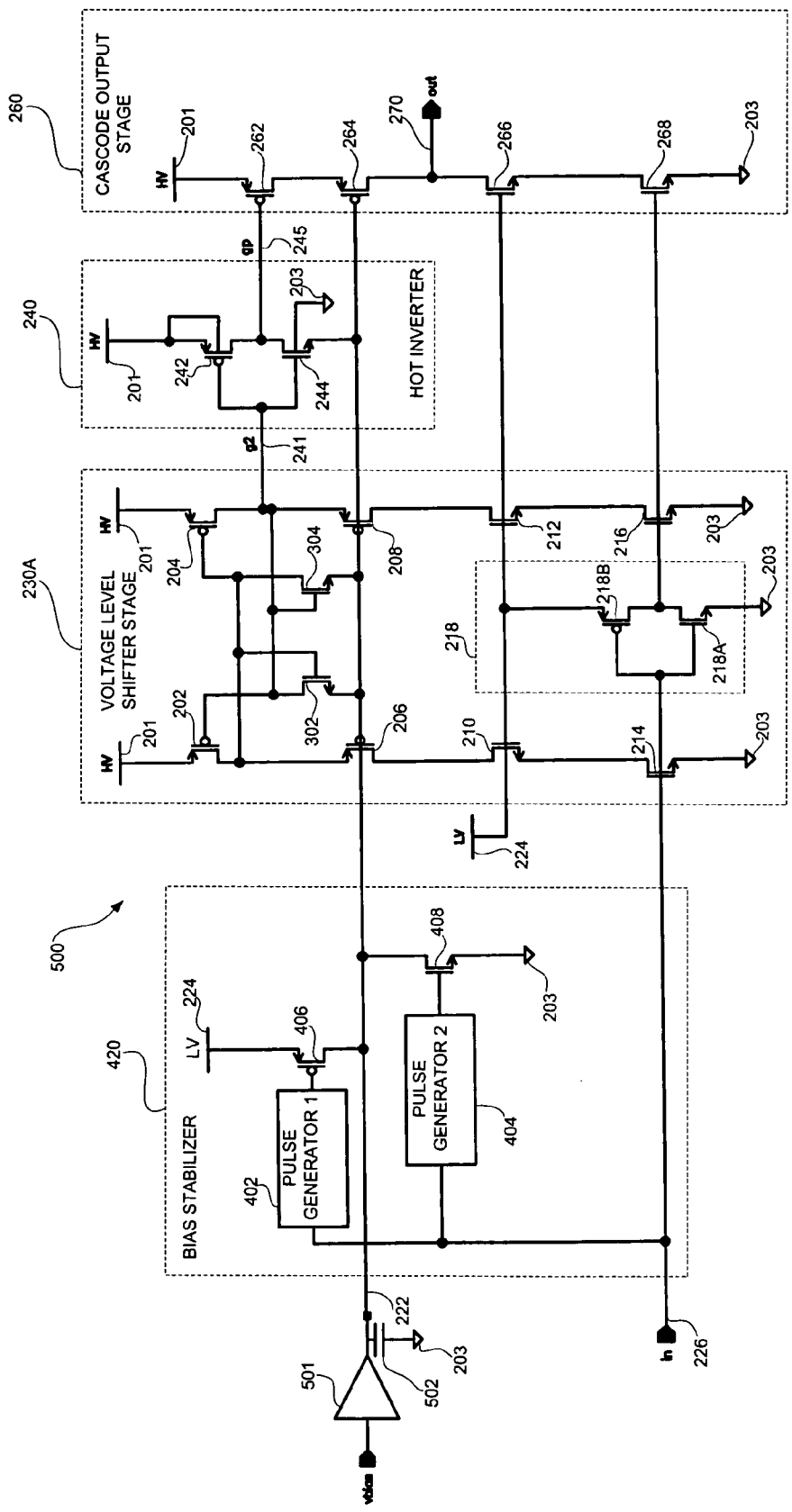
FIG. 5 illustrates a schematic diagram of one embodiment of the high speed MOSFET output driver of FIG. 4 that further includes a bias driver in accordance with an embodiment of the present invention.

FIG. 5 illustrates one embodiment of high speed MOSFET output driver 500 of the present invention that includes a bias driver to improve the sensitivity of bias stabilizer 420 and provide further control of bias voltage ($V_{bias}$) 222. In the present embodiment, high speed MOSFET output driver 500 further includes a bias driver 501 coupled to a capacitor 502. In one embodiment, bias driver 501 is a feedback op-amp operable to improve the output impedance of bias stabilizer 420. In order for bias stabilizer 420 to maintain bias voltage ($V_{bias}$) 222 at a constant level, bias stabilizer 420 is required to have low output impedance to sense the change in bias voltage ($V_{bias}$) 222 at the gate of second PMOS 264 of cascode output stage 260. If bias voltage ($V_{bias}$) 222 is lower than what it is supposed to be, it fails to protect first PMOS transistor 202. Bias driver 501 senses this drop in voltage level and pulls bias voltage ($V_{bias}$) 222 up to the desired level. Thus, bias stabilizer 420 can sense the change in bias voltage ($V_{bias}$) 222 and adjusts accordingly to keep bias voltage ($V_{bias}$) 222 at the desired level. A capacitor 502 is coupled at the output of bias driver 501 to provide further control to bias voltage ($V_{bias}$) 222. When bias voltage ($V_{bias}$) 222 is sufficiently larger than the desired level, capacitor 502 is charged up. When bias voltage ($V_{bias}$) 222 is sufficiently larger than the desired voltage level, capacitor 502 discharges and brings bias voltage level ($V_{bias}$) 222 back up again.

Figure 6:
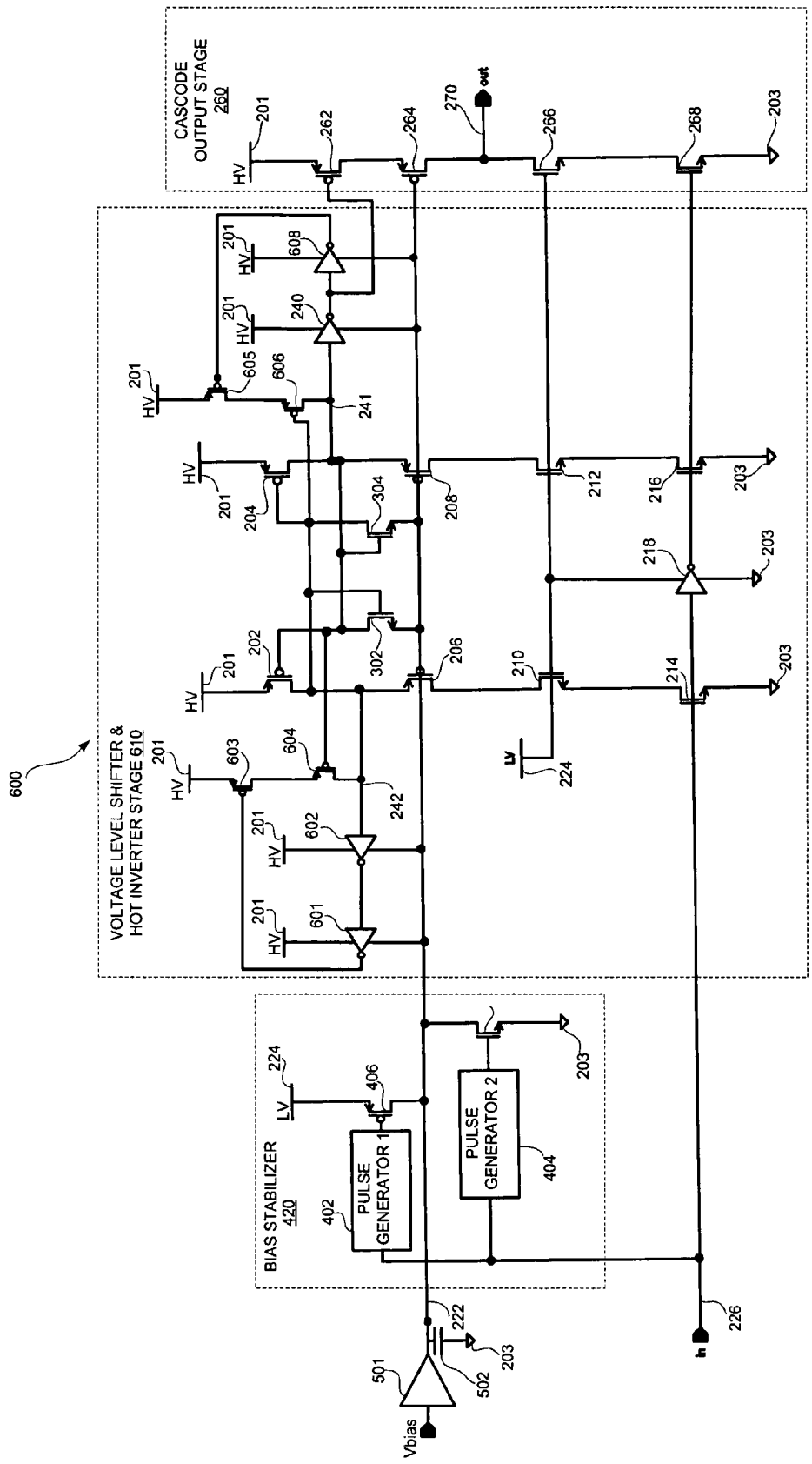
FIG. 6 illustrates a schematic diagram of one embodiment of the high speed MOSFET output driver of FIG. 5 that further includes hot inverters in series and PMOS transistors to speed up the rise time of the output signal of the high speed MOSFET output driver in accordance with an embodiment of the present invention.

FIG. 6 shows one embodiment of a high speed MOSFET output driver 600 that provides further improvement to the rise time of the output signal by using hot inverters 240 and pull-up PMOS transistors coupled to PMOS transistor 202 and to PMOS transistor 204. High speed MOSFET output driver 600 is similar to that described in FIG. 5 except that high speed MOSFET output driver 600 further includes three hot inverters 601, 602, and 608 and four PMOS transistors 603–606. In the present embodiment, hot inverters 601–602 and 608 are the same as hot inverter 240 described above in FIGS. 1–4. Hot inverters 601–602 and 607–608 are biased between first voltage level (HV) 201 and bias voltage ($V_{bias}$) 222. Hot inverters 601–602 are coupled to PMOS transistors 603–604 and to first PMOS transistor 202. Hot inverter 601 and hot inverter 602 are connected together in series. The input of hot inverter 602 is coupled to the drain of PMOS transistor 202. The output of hot inverter 601 is coupled to the gate of PMOS transistor 603. The source of PMOS transistor 603 is connected to second voltage level (HV) 201. The drain of PMOS transistor 603 is connected to the source of PMOS transistor 604. The drain of PMOS transistor 604 is connected the input of hot inverter 602 at node 242. The gate of PMOS transistor 604 is connected to the gate of first PMOS transistor 202.

Continuing with FIG. 6, hot inverters 240 and 608 are coupled to PMOS transistors 605–606 and to second PMOS transistor 204. Hot inverter 240 and hot inverter 608 are connected together in series. The input of hot inverter 240 is coupled to the drain of second PMOS transistor 204. The output of hot inverter 608 is coupled to the gate of PMOS transistor 605. The source of PMOS transistor 605 is connected to second voltage level (HV) 201. The drain of PMOS transistor 605 is connected to the source of PMOS transistor 606. The drain of PMOS transistor 606 is connected the input of hot inverter 240 at node 241. The gate of PMOS transistor 606 is connected to the gate of PMOS transistor 204. The input of hot inverter 608 is connected to the gate of PMOS transistor 262. In the present embodiment, first PMOS transistor 202 and second PMOS transistor 204 are small transistors so that they are easily over powered by PMOS transistor 206 and PMOS transistor 208.

In operation, when input signal 226 is high, the drain of PMOS transistor 202 is pulled down toward bias voltage ($V_{bias}$) 222, overpowering PMOS transistor 202 while PMOS transistor 603 is off already. In response, PMOS transistor 204 and PMOS transistor 606 turn on. PMOS transistor 204 and PMOS transistor 606 pull node 241 to logic high at second voltage level (HV) 201, overpowering NMOS transistor 304. As a result, PMOS transistor 605 is turned on after a small delay. PMOS transistor 603 is also turned off after a small delay. But the gate of PMOS transistor 262 connected to the output of PMOS transistor 607 is low. PMOS transistor 262 turns on and pulls output signal to second voltage level (HV) 201. Similarly, when input signal 226 is low, output signal at output terminal 270 is pulled low. Additional hot inverters 601–602, 240 and 608 and PMOS transistors 603–606 improve the switching speed of high speed MOSFET output driver 600 at node 241 and node 242, which improves the rise time of the output signal.

Figure 7:
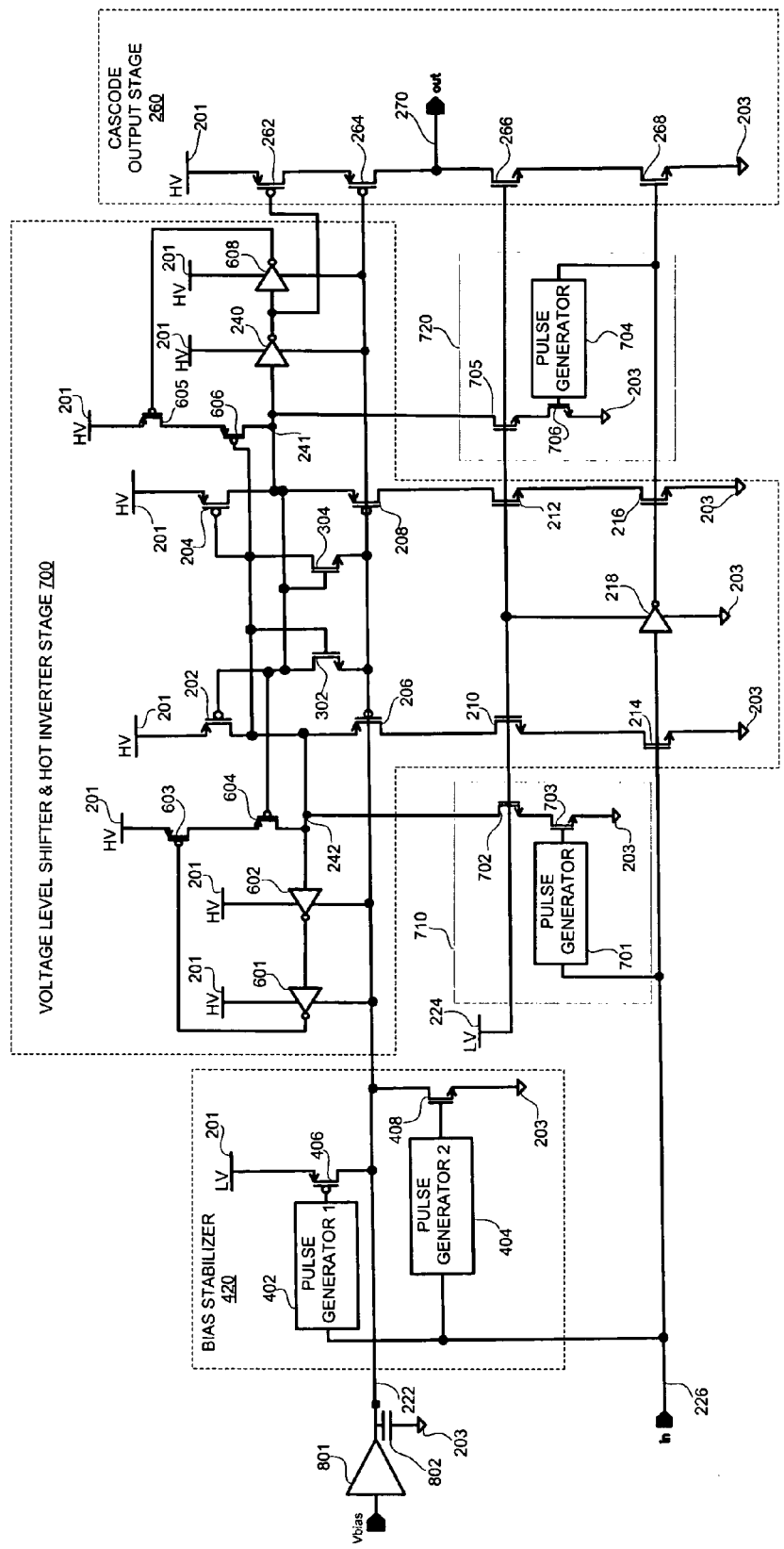
FIG. 7 illustrates a schematic diagram of one embodiment of the high speed MOSFET output driver of FIG. 6 that further includes devices to improve the rise time of the output signal of the high speed MOSFET output driver in accordance with an embodiment of the present invention.

Referring to FIG. 7, one embodiment of high speed MOSFET output driver 700 is shown. High speed MOSFET output driver 700 is similar to high speed MOSFET output driver 600 described in FIG. 6 except that high speed MOSFET output driver 700 further includes two devices 710 and 720 to improve the fall time of node 241 and node 242. Device 710 includes a pulse generator 701 and two NMOS transistors 702–703. The input of pulse generator 701 is connected to input signal 226. The output of pulse generator 701 is connected to the gate of NMOS transistor 703. The source of NMOS transistor 703 is connected to electrical ground 203. The drain of NMOS transistor 703 is connected to the source of NMOS transistor 702. The gate of NMOS transistor 702 is connected to first voltage level (LV) 224. The drain of NMOS transistor 702 is connected to node 242. Device 720 includes a pulse generator 704 and two NMOS transistors 705 and 706. The input terminal of pulse generator 704 is connected to input signal 226. The output terminal of pulse generator 704 is coupled to the gate of NMOS transistor 706. The source of NMOS transistor 706 is connected to electrical ground 203. The drain of NMOS transistor is connected to the source of NMOS transistor 706. The gate of NMOS transistor 705 is coupled to first voltage level (LV) 224. The drain of NMOS transistor 705 is connected to node 241.

In operation, NMOS transistors 703 and NMOS transistor 706 improve the fall time at node 241 and at node 242. PMOS transistor 206 and PMOS transistor 208 are used to prevent gate oxide over stressing of first PMOS transistor 202 and second PMOS transistor 204. However, these PMOS transistors 206 and 208 slow down the fall time of node 241 and 242. When input signal 226 rises, pulse generator 701 generates a short pulse to turn on NMOS transistor 703. The pulse duration is sufficiently short so that when input signal 226 is completely transitioned to bias voltage ($V_{bias}$) 222, the pulses end to avoid pulling node 241 below bias voltage ($V_{bias}$) 222. When input signal 226 falls, pulse generator 704 generates a short pulse to turn on NMOS transistor 706. The pulse duration is sufficiently short so that when signal 241 is completely transitioned to bias voltage ($V_{bias}$) 222 the pulses end to avoid pulling node 242 below bias voltage ($V_{bias}$) 222.

Figure 8:
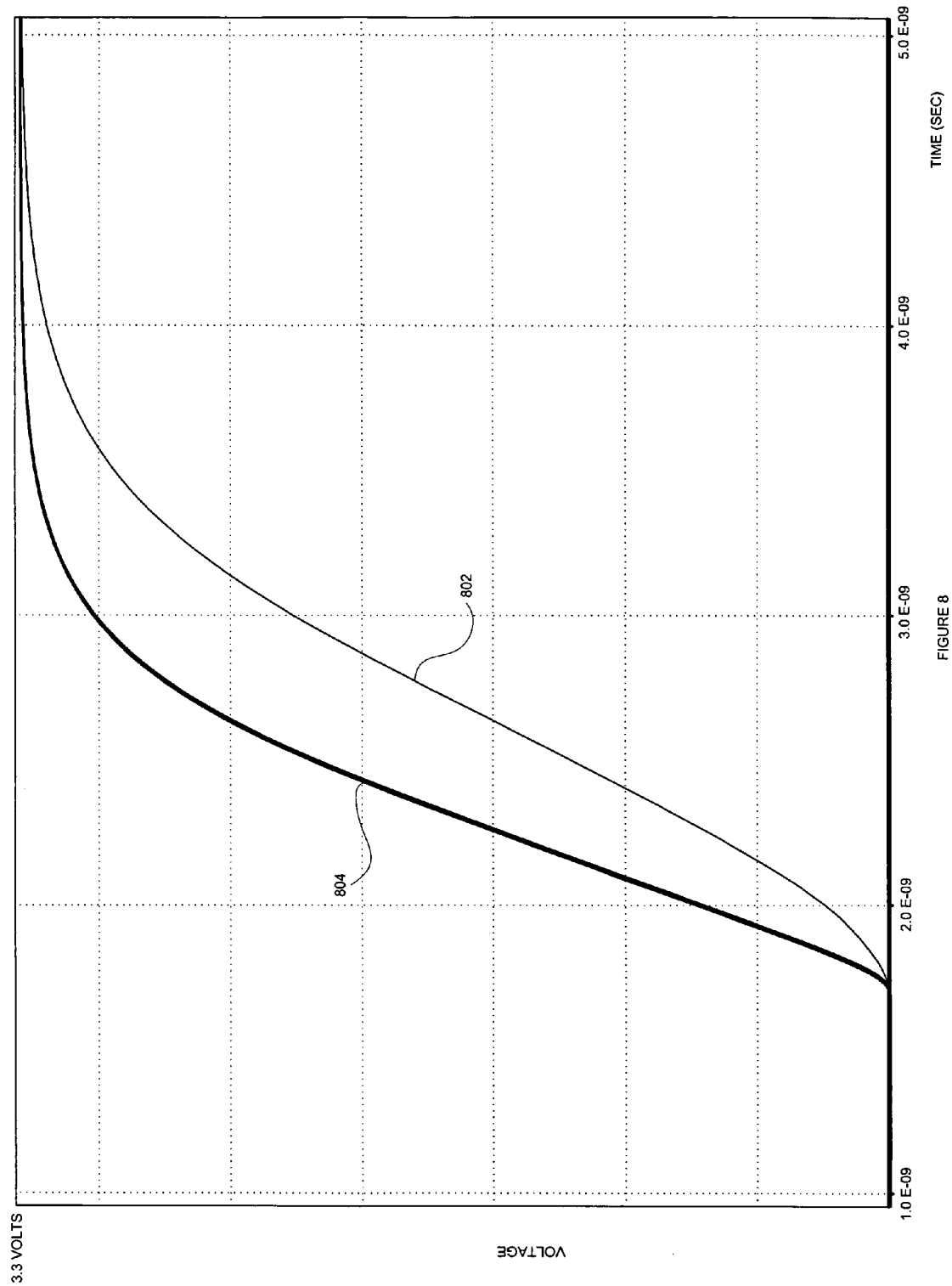
FIG. 8 provides a graph comparing the performance of the output signal of the high speed MOSFET output drivers in accordance with the present invention to an exemplary prior art high voltage output driver.

Referring now to FIG. 8, a graph 800 is shown that compares the performance of the output signal of the high voltage MOSFET output drivers of FIGS. 2–4 to an exemplary prior art output driver. High speed MOSFET output drivers 200–700 lower internal voltage swing in MOS components from the limiting voltage ($V_{bias}+V_{thp}$) to $V_{bias}$, all MOS components can be fabricated using the 0.35 μm thin gate oxide process. Curve 804 represents output signal 270 produced by high speed MOSFET output drivers 200, 300, and 400 in accordance with the present invention. Curve 802 represents output signal of an exemplary prior art high voltage output driver that does not include a hot inverter and that is formed using a dual-gate process. Curve 804 has less propagation delay and thus faster switching time than curve 802, illustrating the increased switching speed of MOSFET output drivers 200–700 of the present invention.

Figure 9:
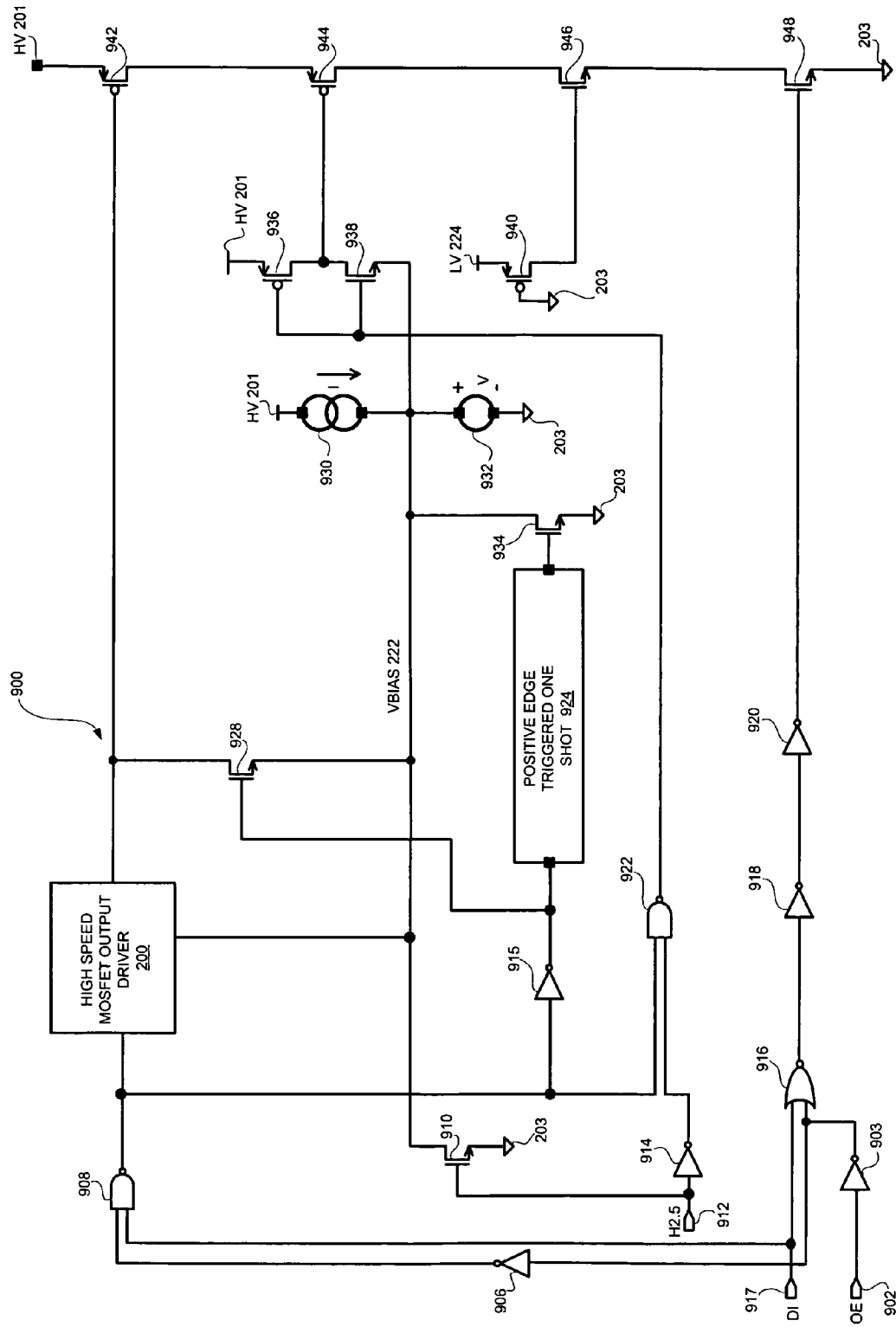
FIG. 9 illustrates a high speed MOSFET output driver that is incorporated in an output drive circuit capable of tolerating variable supply voltages (driver circuit) in accordance with an embodiment of the present invention.

Referring to FIG. 9, a driver circuit 900 is shown that includes a MOSFET output driver 200. Alternatively, high speed MOSFET output driver 300 or 400 could be used in driver circuit 900. Driver circuit 900 includes an indication input terminal (H2.5) 912 indicating which value of second voltage level (HV) 201 is being used. For example, indication input terminal (H2.5) 912 indicates whether a 3.3 volts supply voltage or a 2.5 volts supply voltage is used. More particularly, when indication input terminal (H2.5) 912 is held low, it indicates that second voltage level 201 is a high voltage (3.3 volts). When indication input terminal (H2.5) 912 is held high, it indicates that second voltage level 201 is a low voltage (2.5 volts). Driver circuit 900 includes an enable input terminal (OE) 902, an input signal (DI) 917, indication input terminal (H2.5) 912, high speed MOSFET output driver 200, a positive edge triggered one shot 924, a current source 930, a voltage source 932, NAND gates 908, 922, inverters 903, 906, 914, 915, 918, 920, a NOR gate 916, NMOS transistors 910, 928, 934, 938, 946, 948, and PMOS transistors 936, 940, 942, 944. In one embodiment, driver circuit 900 is used in an output driver circuit such as the drive circuits described in U.S. patent application Ser. No. 11/009,434, titled "An Output Drive Circuit that Accommodates Variable Supply Voltages", by David Pilling, Leo Lee, and Mario Au, and filed on Dec. 9, 2004, which is hereby incorporated by reference in its entirety. As described in the incorporated reference, a drive circuit is described having an indication input terminal and a control circuit. The control circuit being coupled to a voltage that is set to ground when the indication input terminal indicates a low supply voltage and the control circuit being coupled to an intermediate voltage when the indication input terminal indicates a high supply voltage.

Figure 10:
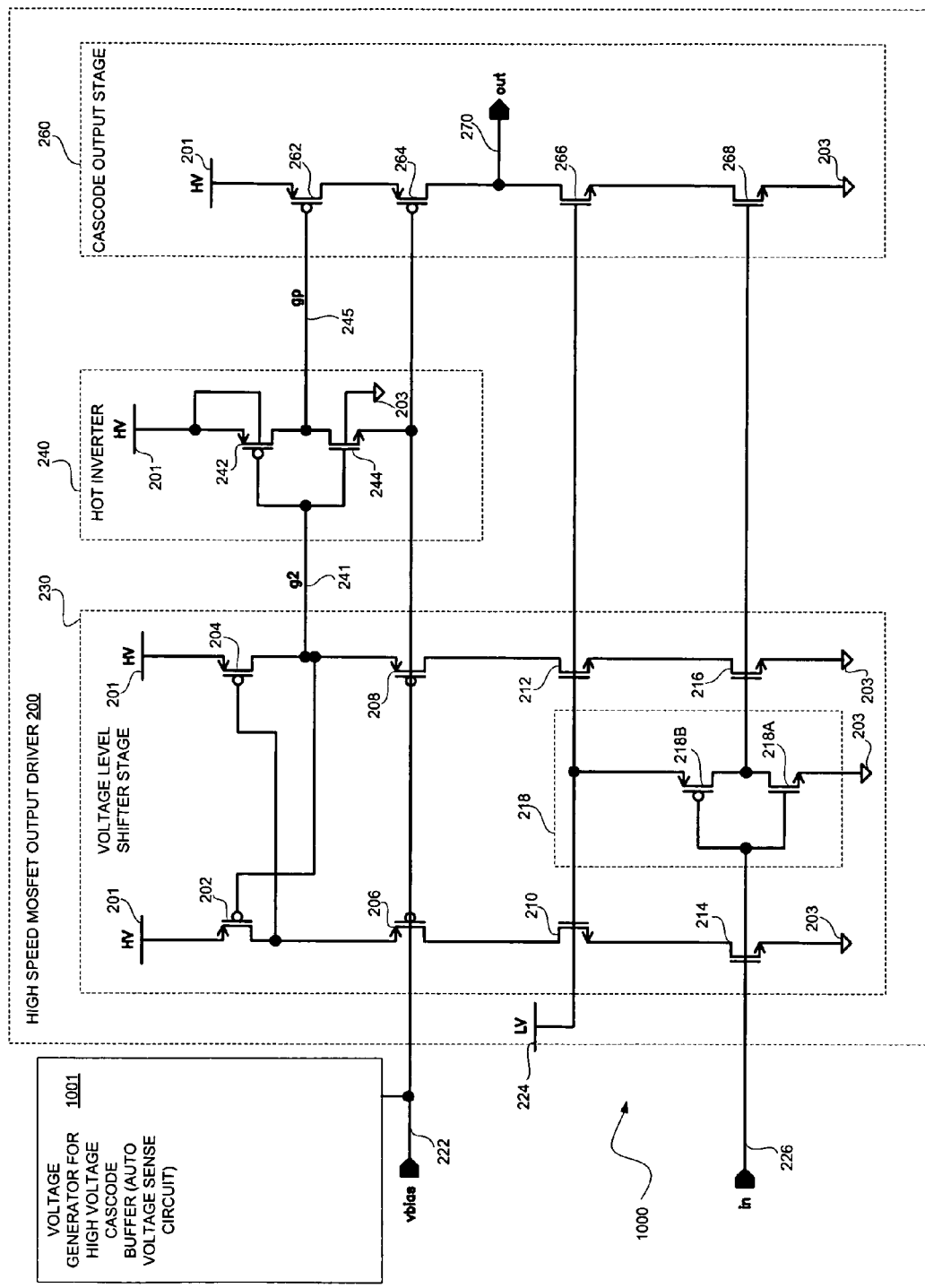
FIG. 10 illustrates a voltage generator for a high voltage cascode buffer (auto voltage sensing circuit) that is used to generate bias voltage ($V_{bias}$) for the high speed MOSFET output drivers of FIGS. 1–4 in accordance with an embodiment of the present invention.

Now referring to FIG. 10, an auto voltage sensing circuit 1001 that can be used to generate bias voltage ($V_{bias}$) 222 in high speed MOSFET output drivers 200–700 in accordance with the present application is illustrated. Auto voltage sensing circuit 1001 includes a first current source, a second current source, and a current mirror. The current mirror takes the currents from first current source and the second current source to generate the desired bias voltage ($V_{bias}$) 222. More particularly, the current mirror subtracts first voltage level (LV) 224 from second voltage level (HV) 201 to generate bias voltage ($V_{bias}$) 222 ($V_{bias}$=HV−LV). In the foregoing way, auto voltage sensing circuit 1001 can automatically track the changes of first voltage level (LV) 222 and second voltage level (HV) 201.

Figure 11:
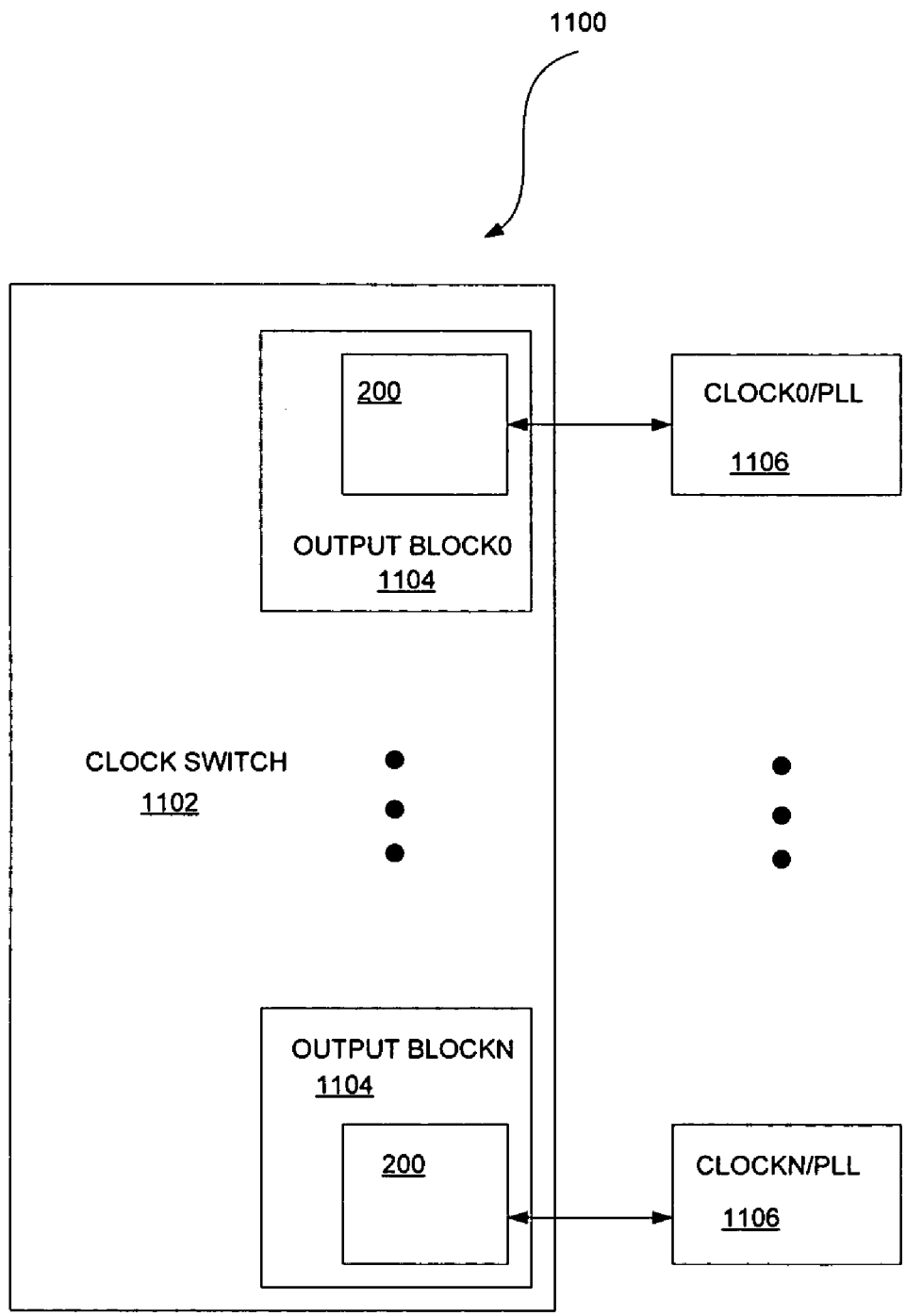
FIG. 11 illustrates an exemplary clock switch that incorporates the high speed MOSFET output driver of the present invention in an output block to distribute clock signals to other local clocks at different logic levels in accordance with an embodiment of the present invention.

Referring to FIG. 11, a MOS system 1100 is shown that includes component 1102 and component 1106 that operate at different voltage levels. MOS system 1100 uses high speed MOSFET output driver 200 of the present invention to shift the voltage level so that component 1102 and component 1106 can communicate with each other. In one embodiment of the present invention, MOS system 1100 includes clock switch 1102 that receives other line clocks, backplane clocks, sub-module clocks, and routes them to any set of other clocks (CLOCK0 to CLOCKN) or Phase Lock Loop (PLL) blocks 1106. For that reason, clock switch 1102 has a plurality of output blocks (OUTOUT BLOCK0 to OUTPUT BLOCKN) 1104 that can support various types of logic voltage levels such as Low Voltage Emitter Coupled Logic (LVECL), Low Voltage Transistor to Transistor Logic (LVTTL), High Speed Transceiver Logic (HSTL), and Low Voltage Differential Signaling (LVDS). In the present embodiment, high speed MOSFET output driver 200 is incorporated inside output blocks 1104 to distribute clock signals local clocks/PLL 1106 at different logic voltages such as Low Voltage Transistor-to-Transistor (LVTTL) logic, Low Voltage Emitter Coupled (LVECL) logic, High Speed Transceiver Logic (HSTL), etc. Alternatively, high speed MOSFET output driver 300–700 can also be incorporated in output blocks 1104 to achieve the same functions. In one embodiment, either driver circuit 900 or auto voltage sensing circuit 1001 can be used with high speed MOSFET output drivers 200–700 inside output block 1104.

Figure 12:
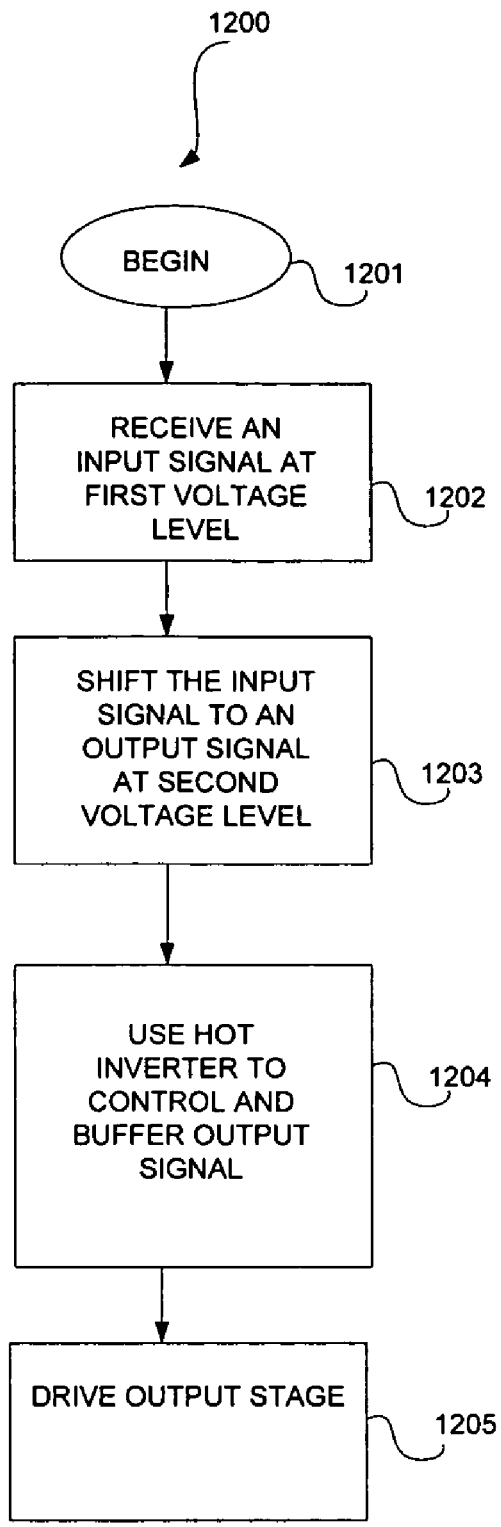
FIG. 12 illustrates a flow diagram of a method of driving an output load with an output signal at a second voltage level using an input signal at a first voltage level in accordance with an embodiment of the present invention.

Now referring to FIG. 12, a method of driving an output load with an output signal at a second voltage level using an input signal at a first voltage level in accordance with the present application is illustrated. A method for high speed voltage level shifting 1200 includes the steps of receiving an input signal at a first voltage level 1202, shifting the input signal at first voltage level to the output signal at second voltage level using a voltage level shifter stage 1203, using a hot inverter to increase the voltage gain for the voltage level shifter stage and at the same time controlling the voltage swing of the output signal applied to the output stage 1204, and driving the output stage using the output signal 1205.

Referring to step 1201, the process begins by initialization and power-up. Before power-up process, second voltage level (HV) 201 is set. Consequently, bias voltage ($V_{bias}$) 222 is also set at step 1201 so that the drain source voltage ($V_{ds}$) is limited to the limiting voltage ($V_{bias}+V_{thp}$). The limiting voltage ($V_{bias}+V_{thp}$) prevents PMOS transistor 202 and PMOS transistor 204 from break-down.

Referring to step 1202, input signal at a first voltage level (LV) is received. FIG. 1 has shown that when first subsystem 102 and second subsystem 104 having different internal operating voltages (first voltage level and second voltage level) are to be used together in MOS system 100, an output signal from first subsystem 102 at its internal operating voltage (first voltage level) is received. Output signal of subsystem 102 is equivalently an input signal at first voltage level (LV) 224 to high speed MOSFET output driver 200. High speed MOSFET output driver 200 is incorporated in first subsystem 102 to drive second subsystem 104 as a load. Referring again to FIG. 11, high speed MOSFET output driver 200 is incorporated in output blocks (OUTPUT BLOCK0–N) 1104 to drive local clocks/PLL (CLOCK0–N) 1106. In this system embodiment of clock switch 1102, input signal at first voltage level (LV) 224 including back plane clocks, sub-module clocks, other line clocks are received at high speed MOSFET output driver 200 inside output blocks (OUTPUT BLOCK0–N) 1104.

Continuing to step 1203, the input signal received at step 1202 is shifted to an output signal at second voltage level (HV) 201. In one embodiment, step 1203 is performed by voltage level shifter stage 230 of FIG. 2. If the input voltage has logic high, NMOS transistor 214 is on, pulling the drain of PMOS transistor 202 and the gate of PMOS transistor 204 toward electrical ground 203. This turns on PMOS transistor 204 and turns off PMOS transistor 202. As a result, output voltage is pulled up to second voltage level (HV) 201. On the other hand, when input signal is at low logic level, NMOS transistor 216 is off and NMOS transistor 218 is on by virtue of inverter 218. As a result, the drain of PMOS transistor 204 and the gate of PMOS transistor 202 are pulled down toward electrical ground 203. Thus, output signal is pulled down to logic low.

Now referring to step 1204, a hot inverter is used to increase the voltage gain for the voltage level shifter stage and at the same time reduce the voltage swing of the output signal applied to the output stage. In the present embodiment, step 1203 and 1204 are performed simultaneously or nearly simultaneously to generate an output signal that is transmitted to the output stage. Referring again to FIG. 12, step 1204 can be performed by hot inverter 240. An inverter is hot because it is not connected to electrical ground 203. In particular, hot inverter 240 is biased between second voltage level (HV) 201 and bias voltage ($V_{bias}$) 222. When input signal is high, input to hot inverter 240 is high. In response, pull-down NMOS transistor 244 turns on and pulls its output toward bias voltage ($V_{bias}$) 222. Thus, the gain of voltage level shifter stage 230 is increased and the minimum voltage level of the output signal introduced to output stage 260 is reduced.

Without hot inverter 240, when input signal is low (i.e., 0 volts), fourth NMOS transistor 216 is on and pulls the drain of second PMOS transistor 204 toward limiting voltage ($V_{bias}+V_{thp}$) where $V_{thp}$ is the threshold voltage of PMOS transistors 206 and 208. This turns on PMOS transistor 202 and turns off PMOS transistor 204. Thus, the voltage introduced to PMOS transistor 262 in output stage 260 is $V_{bias}+V_{thp}$. In contrast, the methods and apparatus of present invention use hot inverter 240 that is biased between second voltage level (HV) 201 and bias voltage ($V_{bias}$) 222. When the input signal is high, input to PMOS transistor 262 is $V_{bias}$, not $V_{bias}+V_{thp}$ because pull-down NMOS transistor 244 pulls the output of hot inverter 240 to bias voltage ($V_{bias}$) 222. The limiting voltage across PMOS transistor 262 is unchanged as it is set by PMOS transistor 264, which is $V_{bias}+V_{thp}$. Table 2 compares the methods and apparatus of the present invention to an exemplary prior art that does not include a hot inverter, illustrating both voltage gain of the voltage level shifter stage and reduced voltage swing to the output stage. Table 2 illustrates the effects of step 1204.

TABLE 2

| | Voltage Gain of Voltage Level Shifting Stage | Voltage Swing to Output Stage |
| --- | --- | --- |
| Without Hot Inverter | HV, $V_{bias} + V_{thp}$ | $V_{bias} + V_{thp}$ |
| With Hot Inverter | HV, $V_{bias}$ | $V_{bias}$ |

Now referring to step 1205, the output stage is driven using the output signal from step 1204. In the embodiment shown in FIG. 2, the gate voltage of PMOS transistor 262 is $V_{bias}$ instead of $V_{bias}+V_{thp}$. Furthermore, lower gate voltage (from $V_{bias}+V_{thp}$ to $V_{bias}$) avoids confusion in logic state of PMOS transistor 262 and thus improves the control of the output signal waveform as well as its transition time. High gate voltage ($V_{bias}+V_{thp}$) can cause PMOS transistor 262 to turn off when it should turn on at this voltage level ($V_{bias}+V_{thp}$). Bias voltage ($V_{bias}$) 222 guarantees that PMOS transistor 262 of output stage 260 will turn on.

Though method 1200 is illustrated as using high speed MOSFET output driver 200, it is appreciated that any of high speed MOSFET output drivers 300–700 could also be used to practice method 1200.

In the present embodiment, steps 1203–1204 are performed simultaneously or nearly simultaneously to generate an output signal that is transmitted to the output stage.

The present embodiment of the present invention is thus described. While the present invention has been described in particular embodiments, it should be appreciated that the present invention should not be construed as limited by such embodiments, but rather construed according to the following claims.

What is claimed is:

1. A high speed metal oxide semiconductor field effect transistor (MOSFET) output driver comprising:
   a voltage level shifter stage having a voltage gain, the voltage level shifter stage operable upon receiving an input signal at a first voltage level to transition the input signal to an output signal at a second voltage level;
   a hot inverter electrically coupled to the voltage level shifter stage and biased between the second voltage level and a bias voltage, said hot inverter operable to increase the voltage gain of the voltage level shifter and to reduce a minimum output level of the output voltage to the bias voltage; and
   an output stage electrically coupled to the voltage level shifter stage and the hot inverter, the output stage operable upon receiving the output signal to drive an output load operating at the second voltage level.

2. The high speed MOSFET output driver of claim 1 wherein the hot inverter further comprises a pull-up PMOS transistor electrically coupled to a pull-down NMOS transistor, the source of the pull-up PMOS transistor electrically coupled to the second voltage level, the source of the pull-down NMOS transistor electrically coupled to the bias voltage, substrates of the pull-up PMOS transistor and the pull-down NMOS transistor electrically coupled to an electrical ground.

3. The high speed MOSFET output driver of claim 1 wherein the second voltage level is greater than the first voltage level and the bias voltage.

4. The high speed MOSFET output driver of claim 1 wherein the output stage is a cascode circuit.

5. The high speed MOSFET output driver of claim 4 wherein the cascode circuit further comprises a first PMOS transistor, a second PMOS transistor, a first NMOS transistor, and a second NMOS transistor, the source of the first PMOS transistor electrically coupled to the second voltage level, the gate of the first PMOS transistor electrically connected to the output of the hot inverter, the drain of the first PMOS transistor electrically coupled to the source of the second PMOS transistor, the gate of the second PMOS transistor electrically connected to the bias voltage, the drain of the second PMOS transistor electrically connected to the drain of the first NMOS transistor to form an output terminal for coupling to the output load, the gate of the first NMOS transistor electrically connected to the input signal, the source of the first NMOS transistor electrically connected to the drain of the second NMOS transistor, the gate of the second NMOS transistor electrically connected to the inverse of the input signal, and the source of the second NMOS transistor electrically connected to an electrical ground.

6. The high speed MOSFET output driver of claim 1 wherein the voltage level shifter stage comprises cascoded PMOS transistors.

7. The high speed MOSFET output driver of claim 1 wherein the voltage shifter stage comprises non-cascoded NMOS transistors.

8. The high speed MOSFET output driver of claim 6 wherein the voltage level shifter stage further comprises:
an output circuit coupled to the second voltage level, the output circuit further comprising a first PMOS transistor cross-coupled to a second PMOS transistor, the sources of the first PMOS transistor and the second PMOS transistor electrically connected to the second voltage level, the gate of the first PMOS transistor electrically coupled to the drain of the second PMOS transistor, the gate of the second PMOS transistor electrically connected to the drain of the first PMOS transistor;
a protecting circuit, electrically coupled to the first voltage level, the bias voltage and the input signal, the protecting circuit further comprising a third PMOS transistor, a fourth PMOS transistor, a first NMOS transistor, a second NMOS transistor, the source of the third PMOS transistor electrically connected to the drain of the first PMOS transistor, the gate of the third PMOS transistor electrically connected to the bias voltage and to the gate of the fourth PMOS transistor, the source of the fourth PMOS transistor electrically connected to the drain of the second PMOS transistor, the drain of the first NMOS transistor electrically connected to the drain of the third PMOS transistor, the gate of the first NMOS transistor electrically coupled to the first voltage level and to the gate of the second NMOS transistor, the drain of the second NMOS transistor electrically coupled to the drain of aid the fourth PMOS transistor; and
an input circuit, electrically coupled to the protecting circuit and the output circuit, the input circuit further comprising a third NMOS transistor, a fourth NMOS transistor, and an inverter, the inverter further comprising a pull-up PMOS transistor and a pull-down NMOS transistor, the gate of the pull-up PMOS transistor electrically connected to the gate of the pull-down NMOS transistor to form an input of the inverter, the source of the pull-up PMOS transistor is electrically connected to the first voltage level, the source of the pull-down NMOS transistor is electrically connected to an electrical ground, the drain of the pull-up PMOS transistor electrically connected to the drain of the pull-down NMOS transistor to form an output of the inverter, the drain of the third NMOS transistor electrically connected to the source of the first NMOS transistor, the gate of the third NMOS transistor electrically coupled to the input of the inverter and to the input signal, the output of the inverter electrically coupled to the gate of the fourth NMOS transistor, the drain of the fourth NMOS transistor electrically coupled to the source of the second NMOS transistor, the sources of the third and fourth NMOS transistors electrically connected to the electrical ground.

9. The high speed MOSFET output driver of claim 7 wherein the voltage shifter stage further comprises:
an output circuit coupled to the second voltage level, the output circuit further comprising a first PMOS transistor cross-coupled to a second PMOS transistor, a first non-cascoded NMOS transistor, and a second non-cascoded NMOS transistor, the sources of the first PMOS transistor and the second PMOS transistor electrically connected to the second voltage level, the gate of the first PMOS transistor electrically connected to the drain of the first non-cascoded NMOS transistor, the gate of the first non-cascoded NMOS transistor electrically connected to the gate of the second PMOS transistor and the drain of the first PMOS transistor, the source of the first non-cascoded NMOS transistor electrically connected to the bias voltage, the gate of the second non-cascoded NMOS transistor electrically connected to the drain of the first non-cascoded NMOS transistor and the drain of the second PMOS transistor, the source of the first and second non-cascoded NMOS transistors electrically connected to the bias voltage, the drain of the second non-cascoded NMOS transistor electrically connected to the gate of the first non-cascoded NMOS transistor;
a protecting circuit coupled to the first voltage level, the bias voltage, the input signal, the protecting circuit further comprising a third PMOS transistor, a fourth PMOS transistor, a third NMOS transistor, and a fourth NMOS transistor, the source of the third PMOS transistor electrically connected to the drain of the first PMOS transistor, the gate of the third PMOS transistor electrically connected to the bias voltage and to the gate of the fourth PMOS transistor, the source of the fourth PMOS transistor electrically connected to the drain of the second PMOS transistor, the drain of the third NMOS transistor electrically connected to the drain of the third PMOS transistor, the gate of the third NMOS transistor electrically coupled to the first voltage level and to the gate of the fourth NMOS transistor, the drain of the fourth NMOS transistor electrically coupled to the drain of the fourth PMOS transistor; and
an input circuit, electrically coupled to the protecting circuit, the input circuit further comprising a fifth NMOS transistor, a sixth NMOS transistor, and an inverter, the inverter further comprising a pull-up PMOS transistor and a pull-down NMOS transistor, the gate of the pull-up PMOS transistor electrically connected to the gate of the pull-down NMOS transistor to form an input of the inverter, the source of the pull-up PMOS transistor is electrically connected to the first voltage level, the source of the pull-down NMOS transistor is electrically connected to an electrical ground, the drain of the pull-up PMOS transistor electrically connected to the drain of the pull-down NMOS transistor to form an output of the inverter, the drain of the fifth NMOS transistor electrically connected to the source of the third NMOS transistor, the input of the inverter electrically connected to the gate of the fifth NMOS transistor and to the input signal, the output of the inverter electrically coupled to the gate of the sixth NMOS transistor, the drain of the sixth NMOS transistor electrically coupled to the source of the fourth NMOS transistor, the sources of the fifth and sixth NMOS transistors electrically connected to the electrical ground.

10. The high speed MOSFET output driver of claim 1 further comprising a bias stabilizer circuit that is electrically coupled to the voltage level shifter stage, the bias stabilizer circuit operable to stabilize the bias voltage.

11. The high speed MOSFET output driver of claim 10 wherein the bias stabilizer circuit further comprises a first pulse generator coupled to a pull-up PMOS transistor, a second pulse generator coupled to a pull-down NMOS transistor, the first pulse generator and the second pulse generator each having an input terminal and an output terminal, the input terminal of the first pulse generator electrically connected to the input terminal of the second pulse generator and the input signal, the output terminal of the first pulse generator electrically connected to the gate of the pull-up PMOS transistor, the source of the pull-up PMOS transistor electrically connected to the first voltage level, the drain of the pull-up PMOS transistor electrically connected to the bias voltage, the output terminal of the second pulse generator electrically connected to the gate of the pull-down NMOS transistor, the drain of the pull-down NMOS transistor electrically connected to the bias voltage level, and the source of the pull-down NMOS transistor electrically connected to an electrical ground.

12. The high speed MOSFET output driver of claim 1 wherein all of the transistors in the MOSFET output driver have approximately the same gate oxide thickness.

13. The high speed MOSFET output driver of claim 1 wherein the high speed MOSFET output driver is not fabricated using a dual gate oxide process.

14. The high speed MOSFET output driver of claim 1 wherein the high speed MOSFET output driver is fabricated using a single thin gate oxide process.

15. A Metal Oxide Semiconductor (MOS) system comprising:
a first subsystem electrically having a nominal operating voltage at a first voltage level;
a second subsystem electrically coupled to communicate with the first subsystem, the second subsystem having a nominal operating voltage level at a second voltage level; and
a high speed MOSFET output driver interfaced between the first subsystem and the second subsystem, the high speed MOSFET output driver further comprising:
a voltage level shifter stage having a voltage gain, the voltage level shifter stage operable upon receiving an input signal at a first voltage level from the first subsystem to transition the input signal to an output signal at a second voltage level;
a hot inverter electrically coupled to the voltage level shifter stage and biased between the second voltage level and a bias voltage, the hot inverter operable to increase the voltage gain of the voltage level shifter stage and to reduce the voltage swing of the output signal; and
an output stage electrically coupled to the voltage level shifter stage and the hot inverter, the output stage operable upon receiving the output signal to drive an output load operating at the second voltage level to the second subsystem.

16. The MOS system of claim 15 wherein the hot inverter further comprises a pull-up PMOS transistor electrically coupled to a pull-down NMOS transistor, the source of the pull-up PMOS transistor electrically coupled to the second voltage level, the source of the pull-down NMOS transistor electrically coupled to the bias voltage, the substrate of the pull-up PMOS transistor electrically coupled to the source, the substrate of the pull-down NMOS transistor electrically coupled to an electrical ground.

17. The MOS system of claim 15 further comprising an output drive circuit capable of accommodating different values of the second voltage level, the output drive circuit comprising:
an indication input terminal operable to receive an input from a user to indicate whether the second voltage level is at a low voltage or at a high voltage; and
a control circuit, coupled to the indication input terminal, operable to generate an intermediate voltage level when the second voltage level is set at the high voltage level, and the control circuit operable to generate an electrical ground voltage level when the second voltage level is set at the low voltage level.

18. The MOS system of claim 15 further comprising a voltage generator that is operable to generate the bias voltage level that automatically detects the first voltage level and the second voltage level.

19. A method of driving an output load with an output signal at a second voltage level using an input signal at a first voltage level, comprising:
receiving the input signal at the first voltage level;
shifting the input signal at the first voltage level to the output signal at the second voltage level using a voltage level shifter stage, the output signal having a minimum voltage level;
increasing a voltage gain for the voltage level shifter stage and substantially simultaneously at the same time reducing the minimum voltage level of the output signal to a bias voltage; and
driving an output stage using the output signal.

20. The method of claim 19 further comprising driving the output load using the output stage.

21. The method of claim 19 wherein the steps of shifting the input signal and increasing the voltage gain are performed substantially simultaneously.

22. A high speed Metal Oxide Semiconductor Field Effect Transistor (MOSFET) output driver, comprising:
means for receiving and shifting an input signal at a first voltage level to an output signal at a second voltage level;
inverter means, electrically coupled to the shifting means, for increasing a voltage gain for the shifting means and for reducing the minimum voltage level of the output signal to a bias voltage; and
means, electrically coupled to the inverter means, for driving an output load using the output signal.

23. The high speed MOSFET output driver of claim 22 wherein the second voltage level is greater than the first voltage level and the bias voltage.

24. The high speed MOSFET output driver of claim 22 wherein the shifting means comprises cascoded PMOS transistor means.

25. The high speed MOSFET output driver of claim 22 wherein the shifting means further comprises non-cascoded NMOS transistor means.

26. The high speed MOSFET output driver of claim 22 further comprising a bias stabilizer means that is electrically coupled to the shifting means, the bias stabilizer means operable to stabilize the bias voltage.

* * * * *

UNITED STATES PATENT AND TRADEMARK OFFICE
CERTIFICATE OF CORRECTION

| | | |
|---|---|---|
| PATENT NO. | : 7,227,400 B1 | Page 1 of 1 |
| APPLICATION NO. | : 11/179072 | |
| DATED | : June 5, 2007 | |
| INVENTOR(S) | : Gillespie et al. | |

It is certified that error appears in the above-identified patent and that said Letters Patent is hereby corrected as shown below:

COL. 15
Claim 8, line 29 "aid the" should read --the--.

COL. 18, Line 44
Claim 19, line 10 "simultaneously at the same time" should read --simultaneously--.

Signed and Sealed this

Twenty-fifth Day of December, 2007

JON W. DUDAS
*Director of the United States Patent and Trademark Office*